United States Patent
Riley et al.

(10) Patent No.: US 6,570,518 B2
(45) Date of Patent: May 27, 2003

(54) MULTIPLE STAGE DELTA SIGMA MODULATOR

(75) Inventors: Thomas A. D. Riley, Osgoode (CA); Tadeuse A. Kwasniewski, Ottawa (CA); Thierry Lepley, Grenoble (FR)

(73) Assignee: Skyworks Solutions, Inc., Newport Beach, CA (US)

( * ) Notice: Subject to any disclaimer, the term of this patent is extended or adjusted under 35 U.S.C. 154(b) by 129 days.

(21) Appl. No.: 09/753,581

(22) Filed: Jan. 4, 2001

(65) Prior Publication Data

US 2001/0035835 A1 Nov. 1, 2001

(30) Foreign Application Priority Data

Jan. 7, 2000 (CA) .............................................. 2294404

(51) Int. Cl.⁷ ................................................ H03M 3/02
(52) U.S. Cl. ........................................ 341/143; 341/76
(58) Field of Search .............................. 341/76, 77, 143

(56) References Cited

U.S. PATENT DOCUMENTS

| | | | | |
|---|---|---|---|---|
| 4,920,544 A | * | 4/1990 | Endo et al. ................... | 341/143 |
| 5,055,802 A | * | 10/1991 | Hietala et al. ................. | 331/16 |
| 5,144,306 A | * | 9/1992 | Masuda ........................ | 341/76 |
| 5,369,403 A | * | 11/1994 | Temes et al. ................. | 341/143 |
| 5,446,460 A | * | 8/1995 | Cabler ......................... | 341/143 |
| 5,654,711 A | * | 8/1997 | Fujimori ...................... | 341/143 |

FOREIGN PATENT DOCUMENTS

| EP | 0 429 217 A2 | * | 5/1991 | ........... H03L/7/197 |
|---|---|---|---|---|
| WO | WO 00/69074 | * | 11/2000 | ............ H03M/3/02 |

OTHER PUBLICATIONS

Karema et al., *An Oversampled Sigma–Delta A/D Converter Circuit Using Two-Stage Fourth Order Modulator*, IEEE Proceedings of International Symposium on Circuits and Systems 1990 (ISCAS '90), pp. 3279–3282.*

* cited by examiner

*Primary Examiner*—Howard L. Williams
(74) *Attorney, Agent, or Firm*—Robert A. Wilkes; Harold C. Baker; Robert G. Hendry

(57) ABSTRACT

A delta sigma modulator which uses at least one quantizer having a dead zone. The dead zone quantizer outputs a zero when its input is within the dead zone range. It outputs a predetermined value if the input is above the dead zone range. If the input is below the dead zone range, the quantizer outputs another predetermined value. Ideally, the quantizer dead zone thresholds are complimentary in that the upper threshold for an input is the positive value of the lower threshold. Also, to save on accumulator bits, the delta sigma modulator selects a predetermined number of most significant bits at different stages.

12 Claims, 4 Drawing Sheets

MULTIPLE STAGE DELTA SIGMA MODULATOR

FIELD OF THE INVENTION

The invention relates to multiple stage delta sigma modulators.

BACKGROUND OF THE INVENTION

Fractional-N synthesizers have many advantages over their conventional counterparts, integer N synthesizers. These include, among others, high frequency resolution, fast channel switching speed, low in-band phase noise, less stringent phase noise requirement on the external VCOs, permitting direct digital modulation.

One way of achieving non-integer multiplication of the reference frequency is through switching the division ratio of the divider among different integers so that the "average" divider output cycle seen by the phase frequency detector is a non-integer multiple of the VCO period. However, the dithering of the rising edge of the divider output, as a result of the switching action, could cause unacceptably high phase noise and sidebands within the loop bandwidth if a simple bit stream generator is employed. Because of this, high order delta sigma modulators capable of shifting low frequency noise into high frequencies are required. The shifted low frequency noise will be subsequently filtered out by the low pass response of the loop.

Unfortunately, such high resolution multi-bit delta sigma modulators consume chip area and power. This leads to a higher cost for integrated circuits and either increases the battery size of portable equipment containing these devices or reduces battery life.

As a rule of thumb, the amount of hardware in a digital delta sigma modulator is roughly proportional to the order of the delta sigma modulator resolution of the delta Sigma modulator. High order modulators are desirable since they provide better noise shaping to reduce the baseband quantization noise. Lower quantization noise Is often necessary to meet phase noise requirements of transmitters or receivers. High resolution is also desirable since this allows very low step size at the synthesizer output. This low step size can be useful for trimming the radio either in production or in the field. Both these desirable features (resolution and order) come at the expense of an increase amount of digital hardware.

To further explain the problem, a 10 bit, fourth order delta sigma modulator of the MASH 1-1-1-1 type requires four 10 bit accumulators along with a smaller amount of logic to implement the Pascals Triangle configuration. Wells, in U.S. Pat. No. 4,609,881 discloses such a modulator. Thus, if we take four 10 bit accumulators as equivalent to 40 single bit accumulators (SBA), the Wells design requires 40 SBA's along with the logic required for the above triangle.

Other delta sigma modulator architectures (such a disclosed by Gaskel in U.S. Pat. No. 5,079,521) have overhead as well. For example, delta sigma modulator architectures composed of cascaded second or higher order stages have a recombination network similar in complexity and size to the Pascals Triangle recombination network.

Another source of overhead arises in second or higher order delta sigma modulators. Here, the number of bits in each accumulator must be larger than the resolution required. As an example, FIG. 10 of U.S. Pat. No. 5,053,802 issued to Heitala shows two 27 bit accumulators for a 24 bit, second order delta sigma modulator. Thus, we would call the 3 bit adder and 6 extra SBA's (3 extra SBA's per accumulator) overhead.

This overhead can be even higher if we wish to accommodate a wide range of synthesizable frequencies. Again, an example can be shown with reference to FIG. 10 in Heitala. The amount of overhead required depends on the input to the delta sigma modulator. When the input is close to the maximum value that can be accommodated in a 24 bit bus, either the number of bits in the feedback logic, or the number of bits in the accumulators has to increase beyond the minimum that is required when the input is close to a value in the middle of the input range.

If reduced digital hardware was required, either the resolution or the order of any given delta sigma modulator architecture had to be reduced.

What is therefore required is a delta sigma modulator which allows a reduction of both overhead hardware and an escape from the traditional constraints on the number of single bit accumulators. Such a modulator would occupy less chip area and reduce power consumption allowing longer battery life or smaller batteries.

SUMMARY OF THE INVENTION

The present invention overcomes the shortcomings of the prior art by providing a method and a delta sigma modulator which uses at least one quantizer having a dead zone. The dead zone quantizer outputs a zero when its input is within the dead zone range. It outputs a predetermined value if the input is above the dead zone range. If the input is below the dead zone range, the quantizer outputs another predetermined value. Ideally, the quantizer dead zone thresholds are complimentary in that the upper threshold for an input is the positive value of the lower threshold.

Also, to save on accumulator bits, the delta sigma modulator selects a predetermined number of most significant bits at different stages.

In one embodiment, the present invention provides a multiple stage delta sigma modulator comprising, a primary first order delta sigma modulator coupled to receive an input and producing an intermediate output which is a quantization of the input and a residue output which is a quantization noise signal, a secondary delta sigma modulator coupled to receive the residue output and producing a secondary output which is a quantization of the residue output and a recombiner coupled to receive the intermediate output and the secondary output and producing a final output, wherein the secondary delta sigma modulator has an order of at least 2.

In another embodiment, the present invention provides a method of reducing components in a delta sigma modulator having multiple stages, said modulator having at least one quantizer, the method comprising quantizing an input signal by selecting a predetermined number of most significant bits in an input signal as a quantizer output.

In yet another embodiment, the invention provides a delta-sigma modulator including a first accumulator, a second accumulator, and a truncation stage coupled between the first accumulator and the second accumulator wherein the truncation stage receives a digital output of the first accumulator, the truncation stage transmits a digital truncation output to the second accumulator, the truncation stage truncates the digital output of the first accumulator to produce the truncation output, and the digital output of the first accumulator has more digits than the truncation output.

Another embodiment of the invention provides a delta-sigma modulator including a quantizer, calculation means to calculate an amount of quantization error introduced by the quantizer such that the quantization error is represented by a digital number, and truncation means to truncate the digital number representing the quantization error wherein the quantizer is coupled to the calculation means and the truncation means is coupled to the calculation means.

BRIEF DESCRIPTION OF THE FIGURES

A better understanding of the invention may be obtained by reading the detailed description of the invention below, in conjunction with the following drawings, in which.

DESCRIPTION OF THE PREFERRED EMBODIMENT

Figure 1:
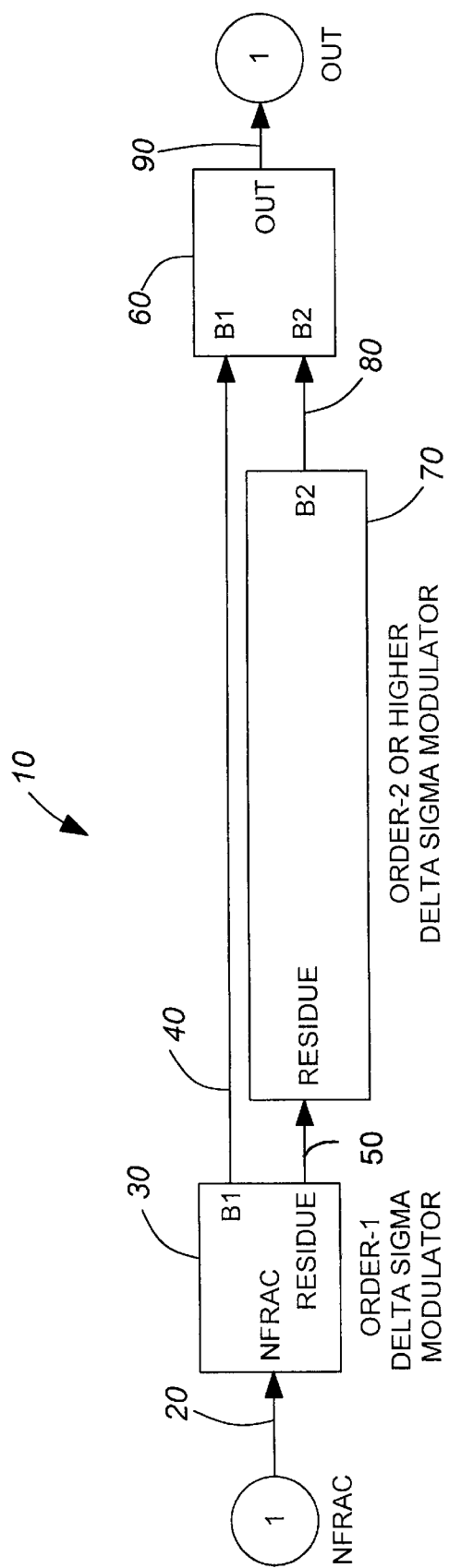
FIG. 1 is a block diagram of a modulator according to the invention.

Referring to FIG. 1, a delta sigma modulator 10 is shown. The input 20 to the modulator 10 is the fractional part of the fractional-N multiplier. This input 20 is fed into a first order delta sigma modulator 30. The output 40 of this first order or primary modulator 30 is a quantized version of the input 20. Also produced by this first modulator is a residue signal 50.

The first modulator output 40 is fed into a recombiner 60. The residue signal 50, corresponding to the error introduced by the first modulator 30, is fed into a second delta signal modulator 70. This second or secondary modulator 70 is preferably at least a second order delta sigma modulator.

The secondary modulator 70 quantizes the residue signal 50 with higher order noise shaping. This output 80 of the secondary modulator 70 is then sent to the recombiner 60. The recombiner 60 combines the output 80 of the secondary modulator 70 with the first modulator output 40 such that the residual error introduced by the first modulator 30 is cancelled out by its quantized approximation, the secondary modulator output 80. This secondary modulator output 80 has a lower baseband quantization noise because of the higher order (at least 2nd order) of the secondary modulator 70. The recombiner 60 thus outputs the final output 90 which is a quantization of the input 20 with minimal noise introduced by the quantization.

Figure 2:
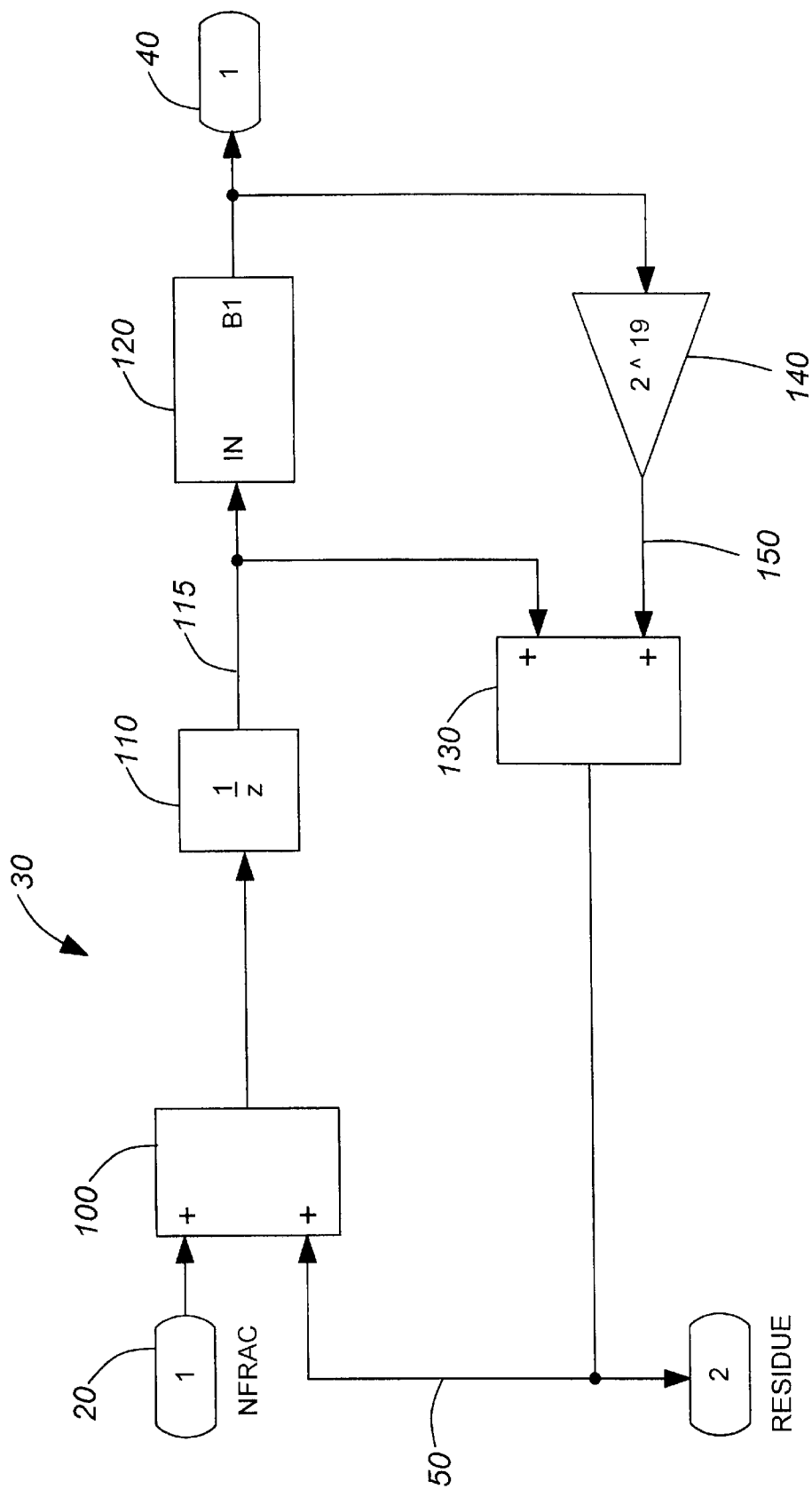
FIG. 2 is a z-transform view of a block diagram of a first order delta sigma modulator according to the invention.

Referring to FIG. 2, a preferred primary first order delta sigma modulator 30 is illustrated. This modulator 30 receives the input 20 at an adder 100. The adder 100 adds this input 20 to what is effectively the residue signal 50. The output of the adder 100 is received by a delay unit 110.

The output 115 of the delay unit 110 is received by a quantizer 120 and a second adder 130. The quantizer 120 is a dead zone quantizer, that is, for certain values of its input, it outputs a zero. Within this dead zone range of inputs, the quantizer 120 has a zero output. If the input to the quantizer is above the dead zone range, the quantizer outputs a 1. If the input is below the dead zone range, the quantizer outputs a −1.

The output 40 of the quantizer 120 is the first modulator output 40. This output 40 is also fed into a gain stage 140. The output 150 of this gain stage 140 is subtracted by the second adder 130 from the delay unit output 115.

The delay unit 110 can be implemented by D flip flops which can act as registers. When the quantizer 120 is within its dead zone, that is the output 40 is zero, the residue signal 50 is equal to the contents of the effective register formed by the delay unit 110. If the quantizer 120 has an output of −1, the residue signal 50 is the sum of the delay unit output 115 (effectively the contents of the register formed by the D flip flops) and the gain output 150. In the figure, the gain output is $2^{19}$ so, when the quantizer output 40 is 1, $2^{19}$ is subtracted from the delay unit output 115. If the quantizer output 40 is −1, $2^{19}$ is added to the delay unit output 115.

In this application, the adder 100 is a 22 bit adder. But, since the addition or subtraction of $2^{19}$ to the contents of the delay unit 110 (again effectively a register) only affects the 3 most significant bits (MSB), the lower 14 bits (the 14LSB) is not affected. The lower 14 bits therefore need not pass through the second adder 130 and can go directly to the residue signal 50.

Now that the function of the second adder 130 and of the gain stage 140 has been disclosed, implementing them should be a straightforward matter for a person skilled in the art.

Figure 3:
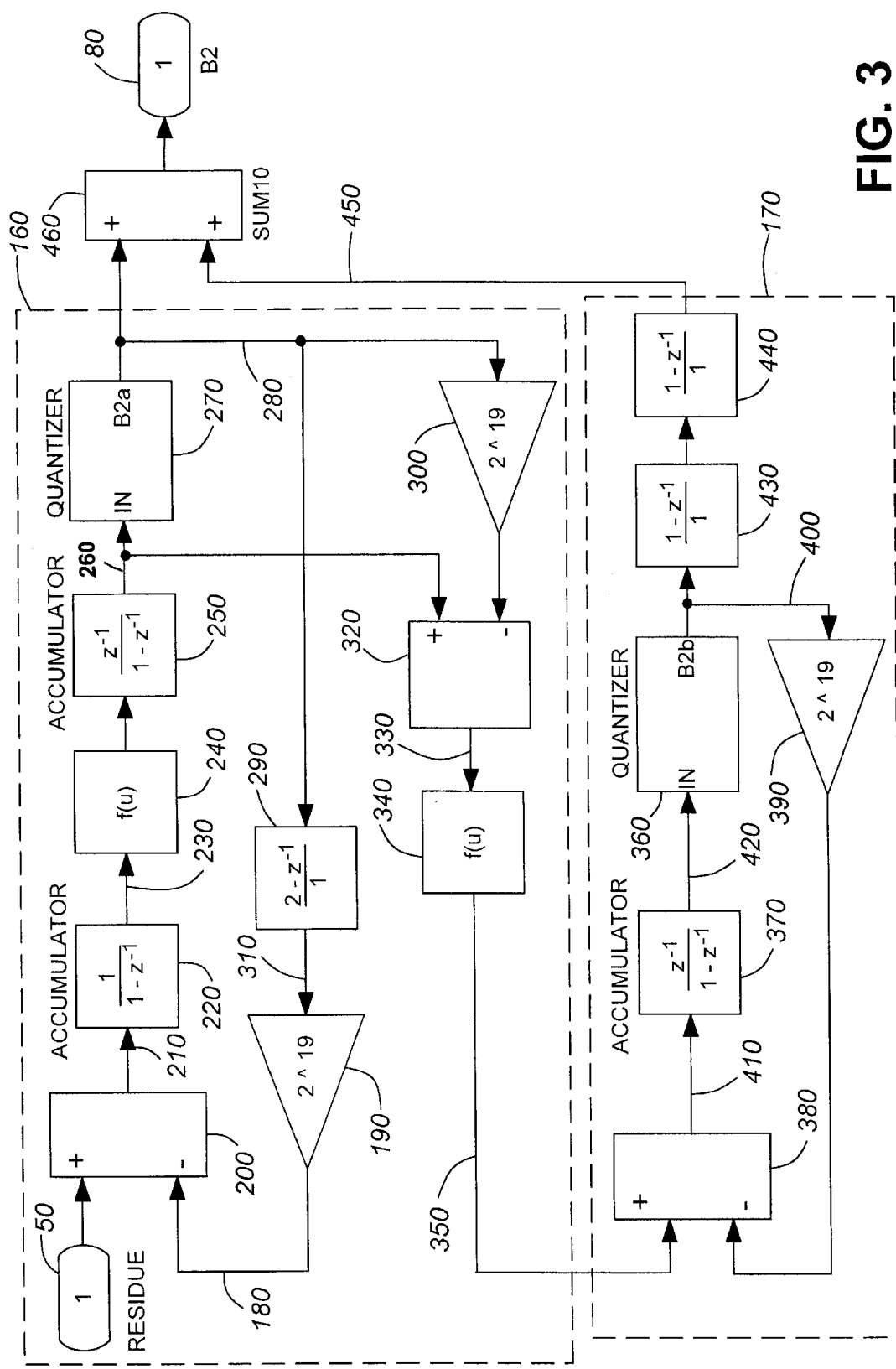
FIG. 3 is a z-transform view of a third order delta sigma modulator according to the invention.

Referring to FIG. 3, a third order delta sigma modulator is shown. This modulator can be used as the secondary modulator 70 illustrated in FIG. 1. It should however, be noted that a second order delta sigma modulator or a higher order delta sigma modulator can be used in the secondary modulator 70.

The third order modulator pictured in FIG. 3 is composed of a secondary first order delta sigma modulator 160 and a secondary second order delta sigma modulator 170. Both of these modulators 160, 170 use dead zone quantizers similar to the dead zone quantizer 120 illustrated in FIG. 1 and described above.

The secondary second order modulator 160 receives the residue signal 50 and subtracts from it an output 180 of a first gain stage 190 by way of a first adder 200. The output 210 of this adder 200 is received by a first accumulator 220. The output 230 of the first accumulator 220 is fed into a first truncation stage 240. This first truncation stage 240 selects the most significant bits (MSBs) from the output 230 of the first accumulator 220. Thus, while the first accumulator 220 requires 22 bits to accommodate the 22 bit residue signal 50, the second accumulator 250, because of the first truncation, stage 240, needs only 12 bits. The 10 LSB from accumulator 220 are not processed further. Tests have shown that noise due to such discarding of bits is negligible.

The output 260 of the second accumulator 250 is then fed into quantizer 270 which is identical in function to quantizer 120 described above.

As can be seen from FIG. 3, the output 280 of the quantizer 270 is fed into a filter 290 and a second gain stage 300. The output 310 of the filter stage 290 is received by the first gain stage 190. The output of the second gain stage 300 is received by a second adder 320. The second adder 320 also receives the output 260 of the second accumulator 250.

Thus, when the quantizer 270 has an output of 0 (within its dead zone) the residue signal 50 passes straight into the first accumulator 220. Also, the output 330 of the second adder 320 is the contents of the second accumulator 250. If, on the other hand, quantizer 270 has an output of −1, a gain of $2^{19}$ is added by the second adder 320 to produce output 330. Also, in this case, if the previous quantizer output was 1, a gain of $3 \times 2^{19}$ is also added to the residue signal 50 to be received by first accumulator 220.

In the third case, with quantizer output 280 being 1, if the previous quantizer output was −1, $3 \times 2^{19}$ is subtracted from the residue value 50 by adder 200 and from the second accumulator 250 value by adder 320.

However, a second truncation stage 340 is placed to receive output 330 of adder 320. Truncation stage 340 selects the 6 MSBs of output 330. Since output 330 is a sum/difference between the contents of accumulator 250 with 12 bits and the gain stage 300 (affecting only the 3 MSB), the output 330 is 12 bits. Truncation stage 340 discards the 6 LSBs of output 330 leaving 6 bits for truncation output 350. This truncation output 350 is then fed into the secondary second order modulator 170.

It should be noted that the output 330 is analogous to residue signal 50 in that output 330 represents the quantization error introduced by quantizer 270.

Because of the above, the widest accumulator or adder needed in secondary modulator 170 should be 6 bits wide.

The interaction between the quantizer 270 in the secondary 160 and a quantizer 360 in the modulator 120 causes the accumulator output 260 to be reduced even before it reaches accumulator 370 in modulator 170.

When quantizer 270 outputs a 1 and quantizer 360 also outputs a 1 a total of $2 \times 2^{19}$ is subtracted from accumulator output 260 even before it reaches accumulator 370. This is because of adder 380 and gain stage 390. Gain stage 390 receives output 400 from quantizer 360 and, depending on output 400, $2^{19}$ is added or subtracted from output 350 by adder 380. However, because of adder 320 and gain stage 300, an extra $2^{19}$ can be added or subtracted from accumulator output 260. Thus, if both quantizers 270, 360 output is one, $2 \times 2^{19}$ is subtracted from accumulator output 260 as it turns into truncated output 350.

In the secondary modulator 170, the output 410 of adder 380 is received by accumulator 370. The output 420 of this accumulator 370 is received by a quantizer 360 similar to the quantizers described above. The output 400 of this quantizer 360 is successively received by filters 430, 440.

These filters output a signal 450 which is added to quantizer output 280 by an adder 460. This adder produces secondary output 80.

Figure 4:
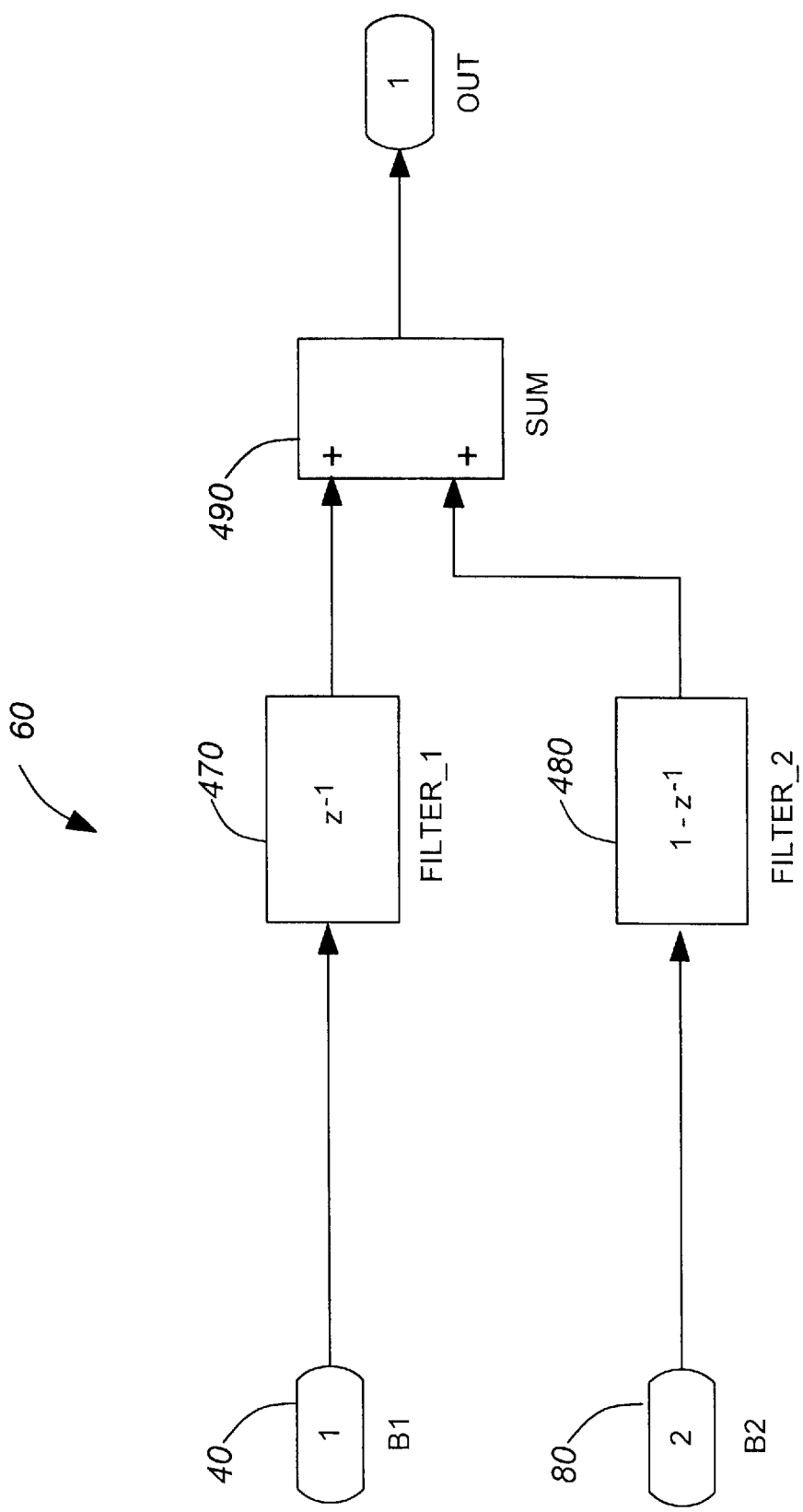
FIG. 4 is a z-transform view of the recombiner according to the invention.

The final component of the modulator 10 is the recombiner 60. Referring to FIG. 4, a 2-transform view of recombiner 60 is shown. The recombiner 60 receives the first modulator output 40 and secondary output 80. A filter 470 delays modulator output 40 until secondary output 80 arrives. Filter 480 allows the secondary output 80 to be subtracted from the relevant modulator output 40 by adder 490. The output of adder 440 is the final output 90.

A person understanding the above-described invention may now conceive of alternative designs, using the principles described herein. All such designs which fall within the scope of the claims appended hereto are considered to be part of the present invention.

We claim:

1. A multiple stage delta sigma modulator comprising:
   a primary first order delta sigma modulator coupled to receive an input and producing an intermediate output which is a quantization of the input and a residue output which is a quantization noise signal;
   a secondary delta sigma modulator coupled to receive the residue output and producing a secondary output which is a quantization of the residue output; and
   a recombiner coupled to receive the intermediate output and the secondary output and producing a final output;
   wherein the secondary delta sigma modulator has an order of at least 2.

2. A modulator as claimed in claim 1 wherein the primary delta sigma modulator comprises:
   a first adder;
   a second adder;
   a delay unit;
   a quantizer having a dead zone and producing the intermediate output; and
   a gain stage;
   wherein
      the first adder is coupled to receive and add the input and an output of the second adder;
      the delay unit is coupled between the first adder and the quantizer;
      the gain stage is coupled to receive the intermediate output from the quantizer;
      the second adder is coupled to receive and subtract an output of the gain stage from an output of the delay unit; and
      the residue output is the output of the second adder.

3. A modulator as claimed in claim 1 wherein the secondary delta sigma modulator comprises:
   a secondary second order delta sigma modulator having a quantizer with a dead zone, said secondary second order delta sigma modulator being coupled to receive the residue output; and
   a secondary first order delta sigma modulator having a quantizer with a dead zone, said secondary first order delta sigma modulator being coupled to receive an output of the secondary second order delta sigma modulator;
   wherein the dead zone is an input range wherein when an input to the quantizer is between two predetermined values, the quantizer output is zero.

4. A modulator as claimed in claim 3 wherein the secondary second order delta sigma modulator comprises:
   a first adder receiving the residue output;
   a first accumulator;
   a second accumulator;
   a second adder;
   a first gain stage;
   a second gain stage;
   a first truncation block;
   a second truncation block;
   a first filter block; and
   a quantizer with a dead zone;
   wherein
      the first adder subtracts an output of the first gain stage from the residue;
      the first accumulator receives an output of the first adder;
      the first truncation block receives an output of the first accumulator;
      the second accumulator receives an output of the first truncation block;
      the quantizer receives an output of the second accumulator;
      an output of the quantizer is received by the first filter block and the second gain stage;
      an output of the first filter block is received by the first gain stage;
      the second adder subtracts an output of the second gain stage from the output of the second accumulator; and
      the second truncated block receives an output of the second adder.

5. A modulator as claimed in claim 4 wherein the secondary first order delta sigma modulator comprises:
   a third adder;
   a third accumulator;

a second quantizer having a dead zone;
a third gain stage;
a second filter block; and
a third filter block;
wherein
the third adder subtracts an output of the third gain stage from the output of the second truncation block;
the third accumulator receives an output of the third adder;
the second quantizer receives an output of the third accumulator;
the third gain stage receives an output of the second quantizer;
the second filter block receives the output of the second quantizer; and
the third filter block receives an output of the second filter block.

6. A modulator as claimed in claim 5 wherein a fourth adder receives and adds the output of the first quantizer and adds the output of the first quantizer and an output of the third filter block to produce the secondary output.

7. A modulator as claimed in claim 1 further including a plurality of delta sigma modulators coupled in sequence between the primary first order modulator and the recombiner wherein one of the plurality of delta sigma modulators uses a quantizer with a dead zone for quantizing an input signal to the quantizer the dead zone being an input range wherein when an input to the quantizer has a value between two predetermined values, the quantizer output is zero.

8. A modulator as claimed in claim 7 wherein the quantizer selects a predetermined number of most significant bits from the input signal as a quantizer output.

9. A delta-sigma modulator including
a first accumulator;
a second accumulator; and
a truncation stage coupled between the first accumulator and the second accumulator; wherein
the truncation stage receives a digital output of the first accumulator;
the truncation stage transmits a digital truncation output to the second accumulator;
the truncation stage truncates the digital output of the first accumulator to produce the truncation output; and
the digital output of the first accumulator has more digits than the truncation output.

10. A delta-sigma modulator as claimed in claim 9 wherein the truncation output is produced by selecting a predetermined number of bits from the digital output of the first accumulator.

11. A delta-sigma modulator including
a quantizer
calculation means to calculate an amount of quantization error introduced by the quantizer such that the quantization error is represented by a digital number; and
truncation means to truncate the digital number representing the quantization error; wherein
the quantizer is coupled to the calculation means; and
the truncation means is coupled to the calculation means.

12. A delta-sigma modulator as claimed in claim 11 wherein the truncation means truncates the digital number representing the quantization error by selecting a predetermined number of bits from the digital number.

* * * * *